(12) United States Patent
Li

(10) Patent No.: US 11,582,885 B2
(45) Date of Patent: Feb. 14, 2023

(54) CIRCUIT BOARD AND METHOD FOR MANUFACTURING CIRCUIT BOARD

(71) Applicants: Avary Holding (Shenzhen) Co., Limited., Shenzhen (CN); QING DING PRECISION ELECTRONICS (HUAIAN) CO., LTD, Huai an (CN)

(72) Inventor: Cheng-Jia Li, Qinhuangdao (CN)

(73) Assignees: Avary Holding (Shenzhen) Co., Limited., Shenzhen (CN); QING DING PRECISION ELECTRONICS (HUAIAN) CO., LTD, Huai an (CN)

( * ) Notice: Subject to any disclaimer, the term of this patent is extended or adjusted under 35 U.S.C. 154(b) by 183 days.

(21) Appl. No.: 17/281,699

(22) PCT Filed: Jan. 15, 2020

(86) PCT No.: PCT/CN2020/072155
§ 371 (c)(1),
(2) Date: Mar. 31, 2021

(87) PCT Pub. No.: WO2021/142644
PCT Pub. Date: Jul. 22, 2021

(65) Prior Publication Data
US 2022/0124935 A1      Apr. 21, 2022

(51) Int. Cl.
*H05K 7/20* (2006.01)
*H05K 3/10* (2006.01)
*H05K 1/02* (2006.01)

(52) U.S. Cl.
CPC .............. *H05K 7/205* (2013.01); *H05K 3/10* (2013.01); *H05K 1/0203* (2013.01); *H05K 3/108* (2013.01)

(58) Field of Classification Search
CPC ....... H05K 7/205; H05K 1/0203–0206; H05K 3/10; H05K 3/108
See application file for complete search history.

(56) References Cited

U.S. PATENT DOCUMENTS

| 8,669,477 | B2 * | 3/2014 | Iwamoto | ............... H05K 3/4608 |
| | | | | 361/783 |
| 9,392,730 | B2 | 7/2016 | Hartmann et al. | |

(Continued)

FOREIGN PATENT DOCUMENTS

| CN | 104994682 A | 10/2015 |
| CN | 105050805 A | 11/2015 |
| CN | 209824123 U | 12/2019 |

*Primary Examiner* — Zachary Pape
(74) *Attorney, Agent, or Firm* — ScienBiziP, P.C.

(57) ABSTRACT

A method for manufacturing a circuit board includes providing an insulating substrate, defining a through hole in the insulating substrate, forming a first conductive layer on two surfaces of the insulating substrate and on an inner wall of the through hole, forming a phase change material layer on a surface of each first conductive layer, forming a seed layer on a surface of the first conductive layer, forming a second conductive layer on a surface of the seed layer, and etching the seed layer, the first conductive layer, and the second conductive layer, so that a first conductive circuit layer and a second conductive circuit layer are respectively formed on two opposite surfaces of the insulating substrate, so that the phase change material layer is embedded in the first conductive circuit layer and in the second conductive circuit layer. The application also provides a circuit board.

10 Claims, 3 Drawing Sheets

(56) References Cited

U.S. PATENT DOCUMENTS

| | | | | |
|---|---|---|---|---|
| 9,491,865 | B1* | 11/2016 | Chen | H05K 1/0206 |
| 10,524,392 | B1* | 12/2019 | Chen | H01L 23/49822 |
| 10,945,332 | B2* | 3/2021 | Silvano De Sousa | H05K 3/22 |
| 11,049,794 | B2* | 6/2021 | Arora | H01L 23/4275 |
| 2014/0369005 | A1* | 12/2014 | Gavillet | H01L 23/427 |
| | | | | 29/890.032 |

* cited by examiner

CIRCUIT BOARD AND METHOD FOR MANUFACTURING CIRCUIT BOARD

FIELD

The application relates to a circuit board and a method for manufacturing a circuit board.

BACKGROUND

Electrical energy consumed by electronic equipment during operation, such as radio frequency power amplifiers, field programmable gate array (FPGA) chips, and power supply products, in addition to providing functions, will mostly be converted into heat. Excess heat may cause the internal temperature of the electronic equipment to rise rapidly. If the heat is not dissipated in time, the electronic equipment will continue to heat up, and eventually cause internal components to fail due to overheating, and in the meantime, the electrical conductivity and stability of the circuit gradually decreases, until short-circuiting or the circuit becomes broken. Overheating will affect the reliability of the electronic equipment. Heat of the circuit board in the electronic equipment may come from the heat of the parts on the circuit board, and from the circuit board itself. In the prior art, methods of adding fans, heat dissipation covers, heat pipes, or embedded metal blocks are commonly used to improve heat dissipation. However, most of the existing technologies focus on heat dissipations of circuit boards and components, and few studies focus on improving heat dissipations of the circuit itself.

Document CN101588707A discloses a heat dissipation device, which wraps a circuit board or component to be heat-dissipated in a housing with a phase-change heat-conducting medium, covers all components on the circuit board, and also dissipates heat of a circuit body in contact with it. However, this method can only dissipate the heat of the local circuits in contact with the phase-change heat-conducting medium, resulting in uneven heat dissipation of the overall circuit, which adversely affects circuit stability.

Document CN207283896U discloses a heat dissipation structure of a multilayer PCB board. A heat dissipation plate made of a wave-shaped high thermal conductivity material is arranged between each layer of the circuit board. The wave-shaped heat dissipation plate supports a space for air circulation in the PCB board, so that heat of the inner circuit layer is dissipated by air cooling. However, the heat dissipation structure occupies a large space, the heat dissipation efficiency of air as a heat transfer medium is slow, and the temperature of the circuit layer may not be reduced in time.

Document CN106658942A discloses a high heat dissipation circuit board. The heat of the circuit layer and the surface of a substrate on the side of the circuit layer is directly transferred through embedded heat dissipation metal blocks and thermally conductive metal blocks to realize heat dissipation of the circuit layer. However, this method is prone to problems such as insufficient glue filling, voids, cracks, and delamination at the connection between the metal blocks and the substrate, and the embedded metal blocks increase the weight of the circuit board and reduce the flexibility of the circuit board, which may not be suitable for the trend of lighted, thinner, shorter, and smaller circuit boards.

Current trends of high density circuit boards, the voltage, current, and transmission time of the circuit board circuits are also increasing, the circuit board circuits have to withstand higher temperature, and heat generated by the circuit board circuits may also increase. If the heat generated from the high density circuit boards is not dissipated in time, it may cause reliability problems in the circuit board. Therefore, improving the heat dissipation performance of the circuit board circuit is an urgent goal to be solved within the art.

SUMMARY OF THE DISCLOSURE

In view of this, it is necessary to provide a method for preparing a circuit board to solve the heat dissipation problem of the circuit board circuit.

The application also provides a circuit board.

A method for preparing a circuit board includes the following steps:

Providing an insulating substrate;

Defining at least one through hole in the insulating substrate;

Forming a patterned first conductive layer on two opposite surfaces of the insulating substrate, the first conductive layer also formed on an inner wall of the through hole to form a conductive hole;

Forming a phase change material layer on a surface of each first conductive layer facing away from the insulating substrate, the phase change material layer also filled in the conductive hole;

Forming a seed layer on a surface of the first conductive layer having the phase change material layer, and then forming a second conductive layer on a surface of the seed layer, wherein the seed layer comprises a conductive top wall formed on a surface of the phase change material layer furthest away from the first conductive layer, a conductive sidewall formed on a side surface of the phase change material layer and on a portion of the first conductive layer, and a conductive portion formed on the surface of the first conductive layer not covered by the conductive top wall and the conductive sidewall; and Etching the conductive portion, the first conductive layer corresponding to the conductive portion, and the second conductive layer corresponding to the conductive portion, so as to respectively form a first conductive circuit layer and a second conductive circuit layer on the opposite surfaces of the substrate, so that the phase change material layer is embedded in the first conductive circuit layer and in the second conductive circuit layer, and the first conductive circuit layer and the second conductive circuit layer are electrically connected through the conductive hole.

A circuit board includes:

An insulating substrate, at least one through hole defined in the insulating substrate;

A first conductive circuit layer;

A second conductive circuit layer, the first conductive circuit layer and the second conductive circuit layer respectively disposed on two oppositely disposed surfaces of the insulating substrate; and A phase change material layer, the phase change material layer embedded in the first conductive circuit layer and the second conductive circuit layer;

Wherein, each of the first conductive circuit layer and the second conductive circuit layer comprises a first conductive layer, a seed layer, and a second conductive layer; the first conductive layer is located on a surface of the insulating substrate, and the first conductive layer is also formed on an inner wall of the through hole to form a conductive hole; the phase change material layer is located on a surface of each first conductive layer facing away from the insulating substrate, and the phase change material layer is also filled in the conductive hole; the seed layer is located on a surface of the first conductive layer having the phase change material layer; the seed layer comprises a conductive top wall formed on a surface of the phase change material layer furthest away from the first conductive layer and a conductive sidewall formed on a side surface of the phase change material layer and on a portion of the first conductive layer; the second conductive layer is located on a surface of the seed layer facing away from the first conductive layer; and the first conductive circuit layer and the second conductive circuit layer are electrically connected through the conductive hole.

In summary, the phase change material layer is embedded in the first conductive circuit layer and the second conductive circuit layer, so that when the circuit board is in use, heat generated by the first conductive circuit layer and the second conductive circuit layer is absorbed by the phase change material layer in the first conductive circuit layer and the second conductive circuit layer, so that a phase change process of the phase change material layer reduces the heat of the circuit board to achieve a uniform temperature effect, thereby realizing the heat dissipation of the circuit board, and also improving the stability of the circuits and the conductive holes, which is suitable for high-density circuit boards, 5G high-frequency circuit boards, etc.

| Symbol Description Of Main Components | |
|---|---|
| Circuit board | 100 |
| Insulating substrate | 10 |
| Through hole | 101 |
| Conductive hole | 102 |
| First conductive layer | 20 |
| Phase change material layer | 30 |
| First phase change portion | 301 |
| Second phase change portion | 302 |

-continued

| Symbol Description Of Main Components | |
|---|---|
| Second conductive layer | 40 |
| First conductive circuit layer | 41 |
| Second conductive circuit layer | 42 |
| Seed layer | 43 |
| Conductive top wall | 431 |
| Conductive sidewall | 432 |
| Conductive portion | 433 |
| First cover film | 50 |
| First adhesive layer | 501 |
| First insulating layer | 502 |
| Bonding pad | 503 |
| Second cover film | 60 |
| Second adhesive layer | 601 |
| Second insulating layer | 602 |
| Protective layer | 70 |
| Electronic component | 80 |

The following specific embodiments will further illustrate this application in conjunction with the above-mentioned drawings.

DETAILED DESCRIPTION

The technical solutions in the embodiments of the present application will be clearly and completely described below in conjunction with the accompanying drawings in the embodiments of the present application. Obviously, the described embodiments are only a part of the embodiments of the present application, rather than all the embodiments. Based on the embodiments in this application, all other embodiments obtained by those of ordinary skill in the art without creative work shall fall within the protection scope of this application.

Unless otherwise defined, all technical and scientific terms used herein have the same meaning as commonly understood by those skilled in the technical field of this application. The terminology used in the specification of the application herein is only for the purpose of describing specific embodiments, and is not intended to limit the application.

In the following, some embodiments of the present application will be described in detail with reference to the accompanying drawings. In the case of no conflict, the following embodiments and features in the embodiments can be combined with each other.

Figure 1:
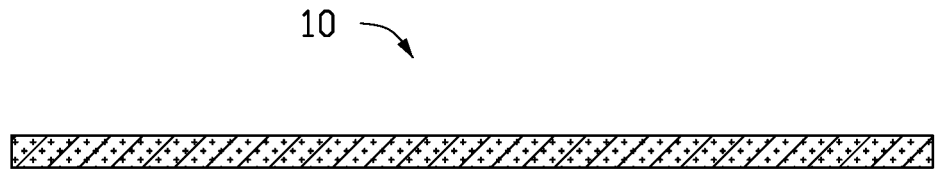
FIG. 1 is a schematic cross-sectional view of a substrate provided by an embodiment of the present disclosure.

Referring to FIG. 1 to FIG. 9, a method for manufacturing a circuit board 100 according to a first embodiment of the present application is provided. According to different requirements, the sequence of steps of the manufacturing method can be changed, and some steps can be omitted or combined. The manufacturing method includes the following steps:

Step S11, referring to FIG. 1, an insulating substrate 10 is provided.

A material of the insulating substrate 10 can be selected from insulating materials such as polyimide (PI), polypropylene (PP), ABF (Ajinomoto Build-up Film) resin, and the like. In this embodiment, the material of the insulating substrate 10 is polyimide.

Figure 2:
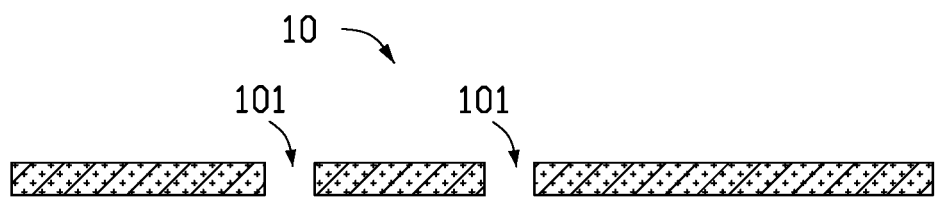
FIG. 2 is a schematic cross-sectional view of the substrate shown in FIG. 1 after defining a through hole.

Step S12, referring to FIG. 2, at least one through hole 101 penetrating the insulating substrate 10 is defined in the insulating substrate 10.

The through hole 101 is formed by laser drilling or mechanical drilling.

Figure 3:
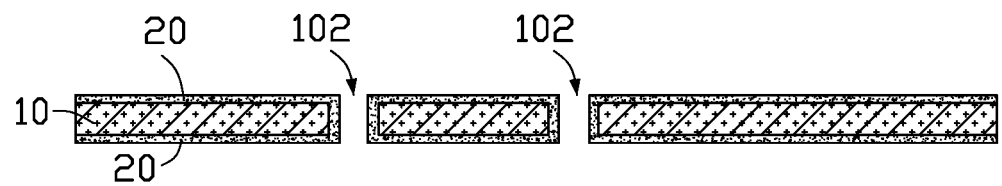
FIG. 3 is a schematic cross-sectional view after forming a first conductive layer on the substrate shown in FIG. 2.

Step S13, referring to FIG. 3, a patterned first conductive layer 20 is formed on two oppositely disposed surfaces of the insulating substrate 10. The first conductive layer 20 is also formed on an inner wall of the through holes 101 to form conductive holes 102. The conductive holes 102 are electrically connected to the first conductive layer 20 on the two opposite surfaces of the insulating substrate 10.

Wherein, the first conductive layer 20 is formed by printing. A material of the first conductive layer 20 is selected from metal materials with excellent thermal conductivity such as silver, gold, copper, and aluminum. In this embodiment, the material of the first conductive layer 20 is silver.

Wherein, a pattern of the first conductive layer 20 is set according to a pattern of a required conductive circuit.

Figure 4:
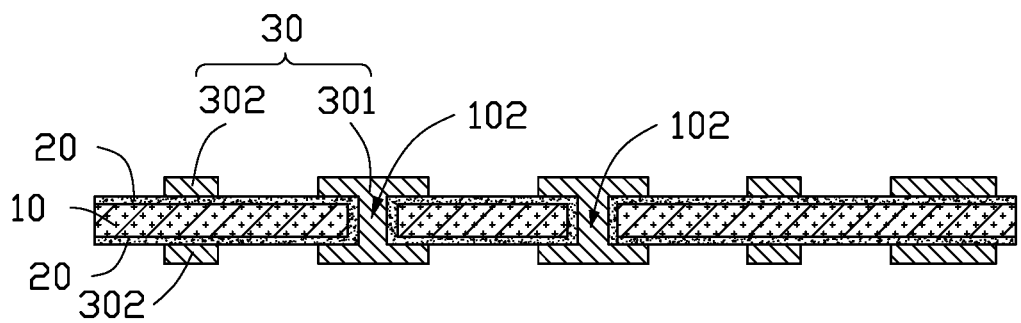
FIG. 4 is a schematic cross-sectional view after forming a phase change material layer on the first conductive layer shown in FIG. 3.

Step S14, referring to FIG. 4, a phase change material layer 30 is formed on a surface of the first conductive layer 20 facing away from the insulating substrate 10. The phase change material layer 30 is also filled in the conductive holes 102.

Specifically, a phase change material is printed on the surface of each first conductive layer 20 facing away from the insulating substrate 10 and completely filled in the conductive holes 102, and then cured to form the phase change material layer 30.

In this embodiment, the phase change material is an insulating phase change material, including inorganic phase change materials, organic phase change materials, and composite phase change materials. The inorganic phase change material can be selected from Na2SO4.10H2O, CaCl2.6H2O, Na2HPO4.12H2O, and the like. The organic phase change material can be selected from paraffin wax, fatty acid and its derivatives, and the like. Preferably, composite phase change materials are selected, such as paraffin-high-density polyethylene, paraffin-expanded graphite, graphite-paraffin-thermoplastic elastomer SBS, graphite-butyl stearate, paraffin-carbon fiber, microcapsule/ nanocapsule phase change material, etc. Wherein, forming the phase change material layer 30 in the conductive holes 102 can improve a reliability in the holes.

In this embodiment, a curing treatment method includes, but is not limited to, normal temperature curing, UV curing, near-infrared curing, electron beam curing, pressure curing, autoclave curing, and the like. The appropriate curing method is selected according to characteristics of the phase change material.

Figure 5:
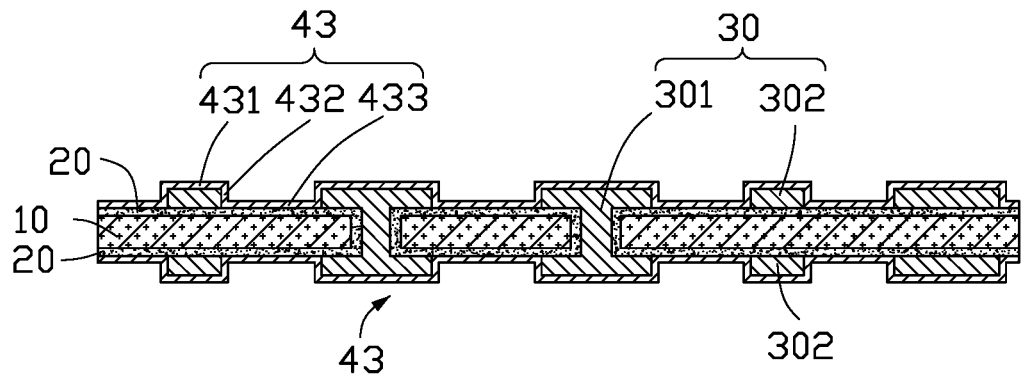
FIG. 5 is a schematic cross-sectional view after forming a seed layer on the phase change material layer shown in FIG. 4.
Figure 6:
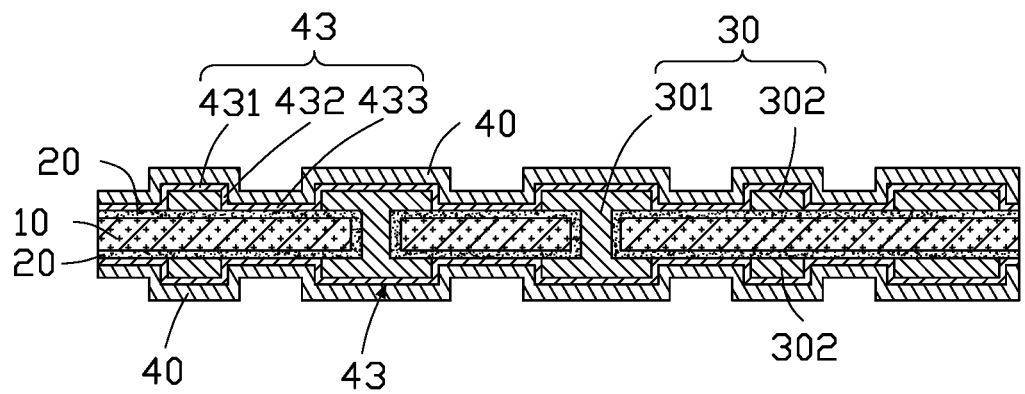
FIG. 6 is a schematic cross-sectional view after forming a second conductive layer on the seed layer shown in FIG. 5.

Step S15, referring to FIGS. 5 and 6, a seed layer 43 is formed on the surface of the first conductive layer 20 having the phase change material layer 30, and then a second conductive layer 40 is formed on a surface of the seed layer 43.

Specifically, referring to FIG. 5, the seed layer 43 includes a conductive top wall 431 formed on a surface of the phase change material layer 30 furthest away from the first conductive layer 20, a conductive sidewall 432 formed on a side surface of the phase change material layer 30 and on a portion of the first conductive layer 20, and a conductive portion 433 formed on the surface of the first conductive layer 20 not covered by the conductive top wall 431 and the conductive sidewall 432. In this way, the second conductive layer 40, the seed layer 43, and the first conductive layer 20 are electrically connected. Wherein, a material of the seed layer 43 and the second conductive layer 40 can be selected from metal materials with excellent thermal conductivity such as silver, gold, copper, and aluminum. In this embodiment, both the seed layer 43 and the second conductive layer 40 are copper.

Among them, due to direct electroplating of metal on the phase change material layer 30, there is a problem that the metal is difficult to adsorb to the phase change material layer 30. Therefore, in this embodiment, an electroless plating method is first adopted to form the seed layer 43 on the surface of the first conductive layer 20 having the phase change material layer 30, and then an electroplating method is adopted to form the second conductive layer 40 on the surface of the seed layer 43, thereby improving a bonding performance between the second conductive layer 40 and the phase change material layer 30.

Figure 7:
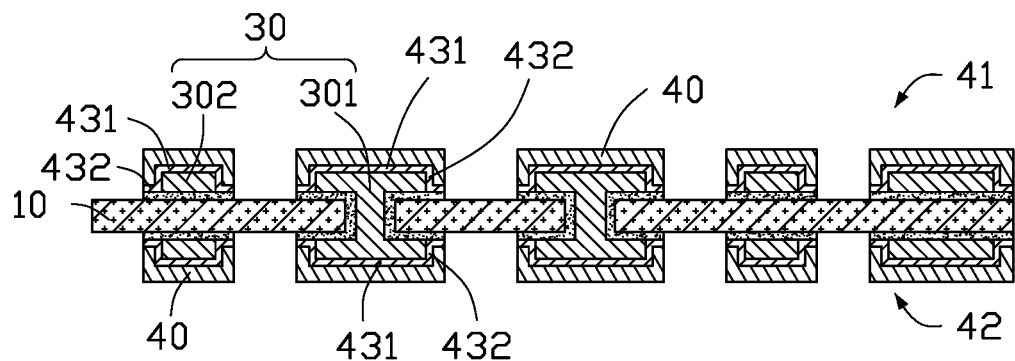
FIG. 7 is a schematic cross-sectional view after etching the first conductive layer, the seed layer, and the second conductive layer shown in FIG. 6 to form a first conductive circuit layer and a second conductive circuit layer.

Step S16, referring to FIG. 7, the conductive portion 433, the first conductive layer 20 corresponding to the conductive portion 433, and the second conductive layer 40 corresponding to the conductive portion 433 are etched, so as to respectively form a first conductive circuit layer 41 and a second conductive circuit layer 42 on the opposite surfaces of the substrate 10, so that the phase change material layer 30 is embedded in the first conductive circuit layer 41 and in the second conductive circuit layer 42.

In this embodiment, the conductive portion 433, the first conductive layer 20, and the second conductive layer 40 can be removed by laser etching.

Wherein, the phase change material layer 30 includes a first phase change portion 301 corresponding to the conductive holes 102 and a second phase change portion 302 outside of the first phase change portion 301. The first phase change portion 301 is enclosed by the conductive top wall 431 and the conductive sidewalls 432 of the seed layer 43 in the first conductive circuit layer 41, the conductive top wall 431 and the conductive sidewalls 432 of the seed layer 43 in the second conductive circuit layer 42, and the first conductive layer 20. The second phase change portion 302 is enclosed by the conductive top wall 431 and the conductive sidewalls 432 of the seed layer 43 and the first conductive layer 20 in the first conductive circuit layer 41, and further enclosed by the conductive top wall 431 and the conductive sidewalls 432 of the seed layer 43 and the first conductive layer 20 in the second conductive circuit layer 42.

Wherein, the conductive holes 102 are electrically connected to the first conductive circuit layer 41 and the second conductive circuit layer 42.

Figure 8:
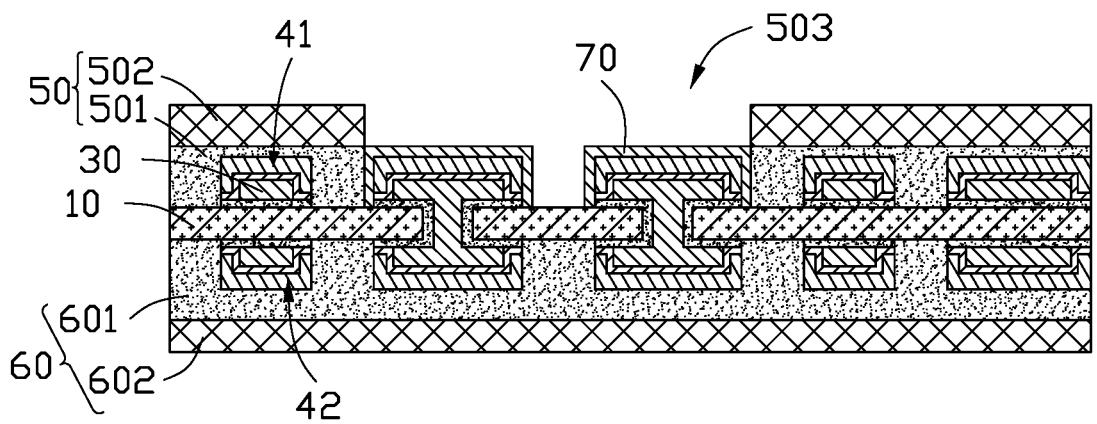
FIG. 8 is a schematic cross-sectional view of the first conductive circuit layer and the second conductive circuit layer shown in FIG. 7 after covering a first cover film and a second cover film and cutting the first cover film, and forming a protective layer.

Step S17, referring to FIG. 8, a first cover film 50 and a second cover film 60 are respectively covered on a surface of the first conductive circuit layer 41 and the second conductive circuit layer 42 facing away from the insulating substrate 10, and then the first cover film 50 is cut to expose a portion of the first conductive circuit layer 41 through the first cover film 50, thereby forming a bonding pad 503.

In this embodiment, a portion of the first conductive circuit layer 41 corresponding to the conductive hole 102 forms the bonding pad 503.

Wherein, the first cover film 50 and the second cover film 60 can be selected from insulating and heat-dissipating materials such as a Teflon cover film, a graphene composite film, and the like. In this way, heat generated by the first conductive circuit layer 41 and the second conductive circuit layer 42 can be conducted and dissipated through the first cover film 50 and the second cover film 60, respectively.

In this embodiment, the first cover film 50 includes a first adhesive layer 501 and a first insulating layer 502. The first adhesive layer 501 is formed on a surface of the first conductive circuit layer 41 facing away from the insulating substrate 10. The first adhesive layer 501 is in a semi-cured state, so that it can flow and fill in gaps of the first conductive circuit layer 41 during a pressing process. A material of the first adhesive layer 501 includes, but is not limited to, commonly used pure glue, PI, PE, PVC, epoxy resin, polyurethane resin, phenolic resin, solder mask, optical adhesive, polypropylene, urea resin, melamine-formaldehyde resin, etc. The first insulating layer 502 is formed on a surface of the first adhesive layer facing away from the first conductive circuit layer 41.

The second cover film 60 includes a second adhesive layer 601 and a second insulating layer 602. The second adhesive layer 601 is formed on a surface of the second conductive circuit layer 42 facing away from the insulating substrate 10. The second adhesive layer 601 is in a semi-cured state, so that it can flow and fill in gaps of the second conductive circuit layer 42 during a pressing process. A material of the second adhesive layer 601 includes, but is not limited to, commonly used pure glue, PI, PE, PVC, epoxy resin, polyurethane resin, phenolic resin, solder mask, optical adhesive, polypropylene, urea resin, melamine-formaldehyde resin, etc. The second insulating layer 602 is formed on a surface of the second adhesive layer 601 facing away from the second conductive circuit layer 42.

Step S18, referring to FIG. 8, a protective layer 70 is formed on a surface of the bonding pad 503.

Wherein, the protective layer 70 is formed by electroless gold plating.

Figure 9:
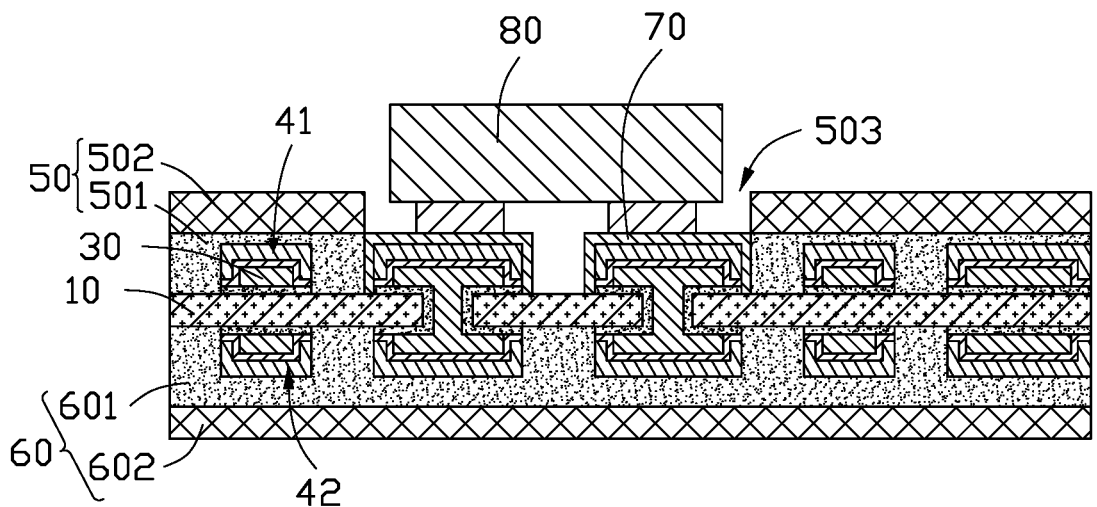
FIG. 9 is a schematic cross-sectional view after an electronic component is disposed on the protective layer of FIG. 8.

Step S19, referring to FIG. 9, an electronic component 80 is disposed on the protective layer 70.

Wherein, heat generated during operation of the electronic component 80 can be transferred to the phase change material layer 30 through the protective layer 70 and the first conductive circuit layer 41 in order to realize heat dissipation of the electronic component 80.

In this embodiment, the electronic component 80 is mounted on the protective layer 70 by surface-mounted technology (SMT).

Figure 10:
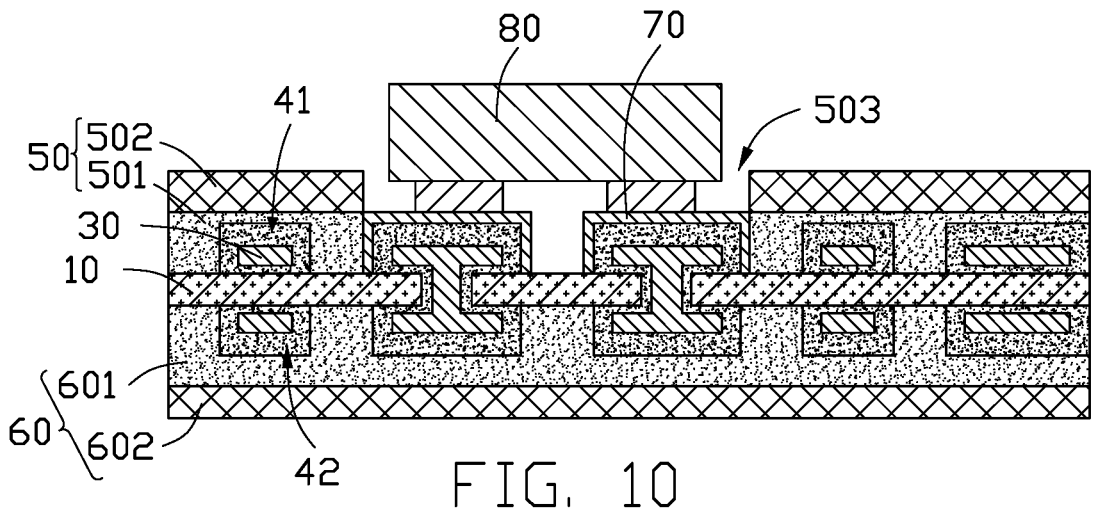
FIG. 10 is a schematic cross-sectional view of a circuit board in another embodiment of the present disclosure.

Referring to FIG. 10, a method for manufacturing the circuit board 100 according to a second embodiment of the present application is provided. The difference between the second embodiment and the first embodiment is that the material of the seed layer 43 and the second conductive layer 40 in the second embodiment is silver. That is, the materials of the first conductive circuit layer 41 and the second conductive circuit layer 42 are all silver.

Referring to FIG. 9, a preferred embodiment of the present application also provides a circuit board 100. The circuit board 100 includes an insulating substrate 10, a phase change material layer 30, a first conductive circuit layer 41, and a second conductive circuit layer 42.

At least one through hole 101 is defined in the insulating substrate 10. The first conductive circuit layer 41 and the second conductive circuit layer 42 are respectively disposed on two oppositely disposed surfaces of the insulating substrate 10. The phase change material layer 30 is embedded in the first conductive circuit layer 41 and the second conductive circuit layer 42.

Specifically, each of the first conductive circuit layer 41 and the second conductive circuit layer 42 includes a first conductive layer 20, a seed layer 43, and a second conductive layer 40. The first conductive layer 20 is located on a surface of the insulating substrate 10, and the first conductive layer 20 is also formed on an inner wall of the through hole 101 to form a conductive hole 102. The phase change material layer 30 is located on a surface of each first conductive layer 20 facing away from the insulating substrate 10, and the phase change material layer 30 is also filled in the conductive hole 102. The seed layer 43 is located on a surface of the first conductive layer 20 having the phase change material layer 30. The seed layer includes a conductive top wall 431 formed on a surface of the phase change material layer 30 furthest away from the first conductive layer 20 and a conductive sidewall 432 formed on a side surface of the phase change material layer 30 and on a portion of the first conductive layer 20. The second conductive layer 40 is located on a surface of the seed layer 43 facing away from the first conductive layer 20. The first conductive circuit layer 41 and the second conductive circuit layer 42 are electrically connected through the conductive hole 102. In this embodiment, the material of the first conductive layer 20 is silver, and the material of the second conductive layer 40 and the seed layer 43 is copper.

In other embodiments, referring to FIG. 10, the materials of the first conductive layer 20, the seed layer 43, and the second conductive layer 40 are all silver.

The circuit board 100 further includes a first cover film 50, a second cover film 60, and an electronic component 80. The first cover film 50 is formed on the surface of the first conductive circuit layer 41 facing away from the insulating substrate 10, and the second cover film 60 is formed on the surface of the second conductive circuit layer 42 facing away from the insulating substrate 10. In this embodiment, the first cover film 50 is cut to expose a portion of the first conductive circuit layer 41 through the first cover film 50 to form a bonding pad 503. The electronic component 80 is connected to the bonding pad 503.

Furthermore, the circuit board 100 further includes a protective layer 70. The protective layer 70 is formed on the surface of the bonding pad 503. The electronic component 80 is connected to the protective layer 70.

In summary, the phase change material layer 30 is embedded in the first conductive circuit layer 41 and the second conductive circuit layer 42, so that when the circuit board 100 is in use, heat generated by the first conductive circuit layer 41 and the second conductive circuit layer 42 is absorbed by the phase change material layer 30 in the first conductive circuit layer 41 and the second conductive circuit layer 42, so that a phase change process of the phase change material layer 30 reduces the heat of the circuit board 100 to achieve a uniform temperature effect, thereby realizing the heat dissipation of the circuit board 100, and also improving the stability of the circuits and the conductive holes, which is suitable for high-density circuit boards, 5G high-frequency circuit boards, etc.

The above are only the preferred embodiments of this application, and do not limit the application in any form. Although the preferred embodiments of this application are disclosed above, they are not intended to limit this application. Anyone familiar with the profession may make modifications to the above embodiments without departing from the scope of the technical solutions of the application, and as long as it does not deviate from the technical solutions of the application, the changes or modifications still fall within the scope of the technical solutions of the present application.

What is claimed is:

1. A method for manufacturing a circuit board, the method comprising:
providing an insulating substrate;
defining at least one through hole in the insulating substrate;
forming a patterned first conductive layer on two opposite surfaces of the insulating substrate, the first conductive layer being further formed on an inner wall of the through hole to form a conductive hole;
forming a phase change material layer on a surface of each first conductive layer facing away from the insulating substrate, the phase change material layer also filled in the conductive hole;

forming a seed layer on a surface of the first conductive layer having the phase change material layer, and then forming a second conductive layer on a surface of the seed layer, wherein the seed layer comprises a conductive top wall formed on a surface of the phase change material layer furthest away from the first conductive layer, a conductive sidewall formed on a side surface of the phase change material layer and on a portion of the first conductive layer, and a conductive portion formed on the surface of the first conductive layer not covered by the conductive top wall and the conductive sidewall; and etching the conductive portion, the first conductive layer corresponding to the conductive portion, and the second conductive layer corresponding to the conductive portion, respectively forming a first conductive circuit layer and a second conductive circuit layer on the opposite surfaces of the insulating substrate so that the phase change material layer is embedded in the first conductive circuit layer and in the second conductive circuit layer, and the first conductive circuit layer and the second conductive circuit layer are electrically connected through the conductive hole.

2. The method for manufacturing a circuit board of claim 1, wherein the first conductive layer is made of silver, and the seed layer and the second conductive layer is made of copper.

3. The method for manufacturing a circuit board of claim 1, wherein the first conductive layer, the seed layer, and the second conductive layer are made of silver.

4. The method for manufacturing a circuit board of claim 1, wherein after forming the first conductive circuit layer and the second conductive circuit layer, the method further comprises:

forming a first cover film on a surface of the first conductive circuit layer facing away from the insulating substrate, and cutting the first cover film, and exposing a portion of the first conductive circuit layer through the first cover film to form a bonding pad;

forming a second cover film on a surface of the second conductive circuit layer facing away from the insulating substrate; and connecting an electronic component to the bonding pad.

5. The method for manufacturing a circuit board of claim 4, wherein before connecting the electronic component, the method further comprises:

forming a protective layer on a surface of the bonding pad, and connecting the electronic component to the protective layer.

6. A circuit board comprising:
an insulating substrate, at least one through hole defined in the insulating substrate;
a first conductive circuit layer;
a second conductive circuit layer, the first conductive circuit layer and the second conductive circuit layer being respectively disposed on two oppositely disposed surfaces of the insulating substrate; and
a phase change material layer embedded in the first conductive circuit layer and the second conductive circuit layer;
wherein, each of the first conductive circuit layer and the second conductive circuit layer comprises a first conductive layer, a seed layer, and a second conductive layer;
wherein the first conductive layer is located on a surface of the insulating substrate, and the first conductive layer is further formed on an inner wall of the through hole to form a conductive hole;
wherein the phase change material layer is located on a surface of each first conductive layer facing away from the insulating substrate, and the phase change material layer is further filled in the conductive hole;
wherein the seed layer is located on a surface of the first conductive layer having the phase change material layer; the seed layer comprises a conductive top wall formed on a surface of the phase change material layer furthest away from the first conductive layer and a conductive sidewall formed on a side surface of the phase change material layer and on a portion of the first conductive layer; and
wherein the second conductive layer is located on a surface of the seed layer facing away from the first conductive layer; and the first conductive circuit layer and the second conductive circuit layer are electrically connected through the conductive hole.

7. The circuit board of claim 6, wherein a material of the first conductive layer is silver, and a material of the seed layer and the second conductive layer is copper.

8. The circuit board of claim 6, wherein a material of the first conductive layer, the seed layer, and the second conductive layer is silver.

9. The circuit board of claim 6, wherein the circuit board further comprises a first cover film, a second cover film, and an electronic component; the first cover film is formed on a surface of the first conductive circuit layer facing away from the insulating substrate; the second cover film is formed on a surface of the second conductive circuit layer facing away from the insulating substrate; a portion of the first conductive circuit layer is exposed through the first cover film to form a bonding pad; and the electronic component is connected to the bonding pad.

10. The circuit board of claim 9, wherein the circuit board further comprises a protective layer formed on a surface of the bonding pad, and the electronic component is connected to the protective layer.

* * * * *